(12) United States Patent
Chen

(10) Patent No.: US 8,947,911 B1
(45) Date of Patent: Feb. 3, 2015

(54) METHOD AND CIRCUIT FOR OPTIMIZING BIT LINE POWER CONSUMPTION

(71) Applicant: United Microelectronics Corp., Hsinchu (TW)

(72) Inventor: Hsi-Wen Chen, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/074,478

(22) Filed: Nov. 7, 2013

(51) Int. Cl.
*G11C 11/00* (2006.01)
*G11C 11/419* (2006.01)

(52) U.S. Cl.
CPC .................................... *G11C 11/419* (2013.01)
USPC ....... 365/154; 365/226; 365/189.07; 365/236

(58) Field of Classification Search
CPC .. G11C 11/4076; G11C 8/04; G11C 11/4087; G11C 16/3418; G11C 29/83; G11C 7/1051; G11C 7/1072; G11C 7/222
USPC ...................... 365/154, 226, 189.07, 236, 204
See application file for complete search history.

(56) References Cited

U.S. PATENT DOCUMENTS

| | | | |
|---|---|---|---|
| 3,663,828 A | 5/1972 | Low et al. | |
| 3,818,402 A | 6/1974 | Golaski et al. | |
| 4,163,944 A | 8/1979 | Chambers et al. | |
| 4,245,355 A | 1/1981 | Pascoe et al. | |
| 4,409,608 A | 10/1983 | Yoder | |
| 4,816,784 A | 3/1989 | Rabjohn | |
| 5,159,205 A | 10/1992 | Gorecki et al. | |
| 5,208,725 A | 5/1993 | Akcasu | |
| 5,212,653 A | 5/1993 | Tanaka | |
| 5,406,447 A | 4/1995 | Miyazaki | |
| 5,446,309 A | 8/1995 | Adachi et al. | |
| 5,583,359 A | 12/1996 | Ng et al. | |
| 5,637,900 A | 6/1997 | Ker et al. | |
| 5,760,456 A | 6/1998 | Grzegorek et al. | |
| 5,808,330 A | 9/1998 | Rostoker et al. | |
| 5,923,225 A | 7/1999 | De Los Santos | |
| 5,959,820 A | 9/1999 | Ker et al. | |
| 6,008,102 A | 12/1999 | Alford et al. | |
| 6,081,146 A | 6/2000 | Shiochi et al. | |
| 6,172,378 B1 | 1/2001 | Hull et al. | |
| 6,194,739 B1 | 2/2001 | Ivanov et al. | |
| 6,246,271 B1 | 6/2001 | Takada et al. | |
| 6,285,578 B1 | 9/2001 | Huang | |

(Continued)

OTHER PUBLICATIONS

Tachibana et al., "A 27% Active and 85% Standby Power Reduction in Dual-Power-Supply SRAM Using BL Power Calculator and Digitally Controllable Retention Circuit," IEEE International Solid-State Circuits Conference, Feb. 20, 2013, pp. 320-321.

*Primary Examiner* — David Lam
(74) *Attorney, Agent, or Firm* — J.C. Patents

(57) ABSTRACT

A bit line power implementing circuit is provided, the bit line power implementing circuit has a bit line discharge oscillator to convert the supply voltage to a pulse; a decoder coupled to the bit line discharge oscillator to decode the pulse, and providing a first pulse with a first frequency and a second pulse with a second frequency; a first and a second counters, coupled to the decoder, and receiving the first and the second pulses respectively, and outputting a signal proportional to an average and a minimum read currents respectively; a divider outputting a read current ratio of the average read current to the minimum read current; and a multiplier for multiplying the supply voltage the read current ratio to output a bit line power consumption corresponding to the supply voltage.

20 Claims, 16 Drawing Sheets

(56) References Cited

U.S. PATENT DOCUMENTS

| | | | |
|---|---|---|---|
| 6,291,872 B1 | 9/2001 | Wang et al. |
| 6,370,372 B1 | 4/2002 | Molnar et al. |
| 6,407,412 B1 | 6/2002 | Iniewski et al. |
| 6,427,226 B1 | 7/2002 | Mallick et al. |
| 6,448,858 B1 | 9/2002 | Helms et al. |
| 6,452,442 B1 | 9/2002 | Laude |
| 6,456,221 B2 | 9/2002 | Low et al. |
| 6,461,914 B1 | 10/2002 | Roberts et al. |
| 6,480,137 B2 | 11/2002 | Kulkarni et al. |
| 6,483,188 B1 | 11/2002 | Yue et al. |
| 6,486,765 B1 | 11/2002 | Katayanagi |
| 6,509,805 B2 | 1/2003 | Ochiai |
| 6,518,165 B1 | 2/2003 | Yoon et al. |
| 6,521,939 B1 | 2/2003 | Yeo et al. |
| 6,545,547 B2 | 4/2003 | Fridi et al. |
| 6,560,306 B1 | 5/2003 | Duffy et al. |
| 6,588,002 B1 | 7/2003 | Lampaert et al. |
| 6,593,838 B2 | 7/2003 | Yue |
| 6,603,360 B2 | 8/2003 | Kim et al. |
| 6,608,363 B1 | 8/2003 | Fazelpour |
| 6,611,223 B2 | 8/2003 | Low et al. |
| 6,625,077 B2 | 9/2003 | Chen |
| 6,630,897 B2 | 10/2003 | Low et al. |
| 6,639,298 B2 | 10/2003 | Chaudhry et al. |
| 6,653,868 B2 | 11/2003 | Oodaira et al. |
| 6,668,358 B2 | 12/2003 | Friend et al. |
| 6,700,771 B2 | 3/2004 | Bhattacharyya |
| 6,720,608 B2 | 4/2004 | Lee |
| 6,724,677 B1 | 4/2004 | Su et al. |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar et al. |
| 6,822,282 B2 | 11/2004 | Randazzo et al. |
| 6,822,312 B2 | 11/2004 | Sowlati et al. |
| 6,833,756 B2 | 12/2004 | Ranganathan |
| 6,841,847 B2 | 1/2005 | Sia et al. |
| 6,847,572 B2 | 1/2005 | Lee et al. |
| 6,853,272 B1 | 2/2005 | Hughes |
| 6,876,056 B2 | 4/2005 | Tilmans et al. |
| 6,885,534 B2 | 4/2005 | Ker et al. |
| 6,901,126 B1 | 5/2005 | Gu |
| 6,905,889 B2 | 6/2005 | Lowther |
| 6,909,149 B2 | 6/2005 | Russ et al. |
| 6,927,664 B2 | 8/2005 | Nakatani et al. |
| 6,958,522 B2 | 10/2005 | Clevenger et al. |
| 7,009,252 B2 | 3/2006 | Lin et al. |
| 7,027,276 B2 | 4/2006 | Chen |
| 7,205,612 B2 | 4/2007 | Cai et al. |
| 7,262,069 B2 | 8/2007 | Chung et al. |
| 7,365,627 B2 | 4/2008 | Yen et al. |
| 7,368,761 B1 | 5/2008 | Lai et al. |
| 7,405,642 B1 | 7/2008 | Hsu et al. |
| 7,486,586 B2 * | 2/2009 | Fifield et al. ................. 365/226 |
| 7,672,100 B2 | 3/2010 | Van Camp |
| 2002/0019123 A1 | 2/2002 | Ma et al. |
| 2002/0036545 A1 | 3/2002 | Fridi et al. |
| 2002/0188920 A1 | 12/2002 | Lampaert et al. |
| 2003/0076636 A1 | 4/2003 | Ker et al. |
| 2003/0127691 A1 | 7/2003 | Yue et al. |
| 2003/0183403 A1 | 10/2003 | Kluge et al. |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean et al. |
| 2006/0108694 A1 | 5/2006 | Hung et al. |
| 2006/0267102 A1 | 11/2006 | Cheng et al. |
| 2007/0102745 A1 | 5/2007 | Hsu et al. |
| 2007/0210416 A1 | 9/2007 | Hsu et al. |
| 2007/0234554 A1 | 10/2007 | Hung et al. |
| 2007/0246801 A1 | 10/2007 | Hung et al. |
| 2007/0249294 A1 | 10/2007 | Wu et al. |
| 2007/0296055 A1 | 12/2007 | Yen et al. |
| 2008/0094166 A1 | 4/2008 | Hsu et al. |
| 2008/0185679 A1 | 8/2008 | Hsu et al. |
| 2008/0189662 A1 | 8/2008 | Nandy et al. |
| 2008/0200132 A1 | 8/2008 | Hsu et al. |
| 2008/0299738 A1 | 12/2008 | Hsu et al. |
| 2008/0303623 A1 | 12/2008 | Hsu et al. |
| 2009/0029324 A1 | 1/2009 | Clark |
| 2009/0201625 A1 | 8/2009 | Liao et al. |
| 2010/0279484 A1 | 11/2010 | Wang et al. |

* cited by examiner

METHOD AND CIRCUIT FOR OPTIMIZING BIT LINE POWER CONSUMPTION

BACKGROUND OF THE INVENTION

1. Field of the Invention

The invention relates to a method and circuit for optimizing bit line power consumption.

2. Description of Related Art

Static Random Access Memory (SRAM) is a type of semiconductor memory and widely applied to many electronic devices. FIG. 1A shows an ordinarily exemplary structure of 6-transistor SRAM (6T SRAM). In such 6T SRAM, two transistors are passing gates each of which a gate is connected to a word lines and one source/drain is connected to bit line BL/$\overline{BL}$. Other kinds of SRAM can use 4T, 8T, 10T, or more transistors per cell.

Referring to FIG. 1B, when reading a memory cell, the bit lines BL/$\overline{BL}$ connected to the passing gates PG of the memory cell are pre-charged to a supply voltage, i.e., VDD or VCS, then the bit line is discharged so that the voltage is deviated from the pre-charged voltage (or refer to an offset voltage). In this way, after the offset voltage is sensed by a sense amplifier, the bit value stored in the memory can be read according to the offset voltage, i.e., $\Delta V_{BL}$. For conventional manufacturing process, the power (energy) consumption of the bit line of the memory cell can be expressed by the following expression (1).

$$E_{BL}=P_{BL} \times t = C_{BL} \times \Delta V_{BL} \times V_{CS} \quad (1)$$

Usually, the bit line capacitance is almost a constant, and $\Delta V_{BL}$ can be also treated as a constant. In general, $\Delta V_{BL}$ is about 100 mV. Therefore, one can concludes that the power (energy) consumption $E_{BL}$ can be decreased if the power voltage $V_{CS}$ is decreased. FIG. 1C illustrates a relationship between the energy power cycle and the supply voltage $V_{CS}$ for the memory cell. As shown, the bit line power $P_{BL}$ is substantial increased while the voltage source $V_{CS}$ is increased.

However, in current advanced process, such as process for 40 nm, 28 nm or 14 nm, etc., $\Delta V_{BL}$ will be varied with the process, voltage and temperature, etc. the voltage $\Delta V_{BL}$ can not be treated as a constant. Therefore, there is a need of method or system for providing more precise simulation to optimize the bit line power consumption for such advanced process or others.

SUMMARY OF THE INVENTION

In view of above, a method and circuit for optimizing bit line power consumption is provided to efficiently and precisely optimize the bit line power consumption.

In one embodiment, a bit line power implementing circuit for memory cells having an average and a worst threshold voltages is provided. The bit line power implementing circuit comprises a bit line discharge oscillator, a decoder, a first and a second counters, a divider and a multiplier. The bit line discharge oscillator receives a supply voltage and converts the supply voltage to a pulse. The decoder is coupled to the bit line discharge oscillator to decode the pulse, and provides a first pulse with a first frequency and a second pulse with a second frequency. The first counter is coupled to the decoder, and receives the first pulse with the first frequency, and outputs a signal proportional to the average read current. The second counter is coupled to the decoder, and receives the first pulse with the first frequency, and outputs a signal proportional to the minimum read current. The divider is coupled to the first and the second counters, and outputs a read current ratio of the average read current to the minimum read current. The multiplier is coupled to the divider to multiply the supply voltage the read current ratio to output a bit line power consumption corresponding to the supply voltage.

In another embodiment, a bit line power optimizing circuit for memory cells having an average and a worst threshold voltages is further provided. In addition to the above bit line power implementing circuit, the optimizing circuit further comprises a power source, providing the supply voltage to the bit line discharge oscillator; a first register, coupled to the multiplier, for storing a previous bit line power consumption; a comparator, coupled to the multiplier and the first register, receiving a current bit line power consumption, for comparing the current and the previous bit line power consumptions, and outputting a comparison result; a second register, for storing the supply voltage; and an operating unit, coupled to the second register and the comparator, for receiving the comparison result and perform an operation on the supply voltage. When the current bit line power consumption is smaller than the previous bit line power consumption, the comparison result makes the operating unit to decreases the supply voltage by a preset amount, and provide the decreased supply voltage to the power source. When the current bit line power consumption is larger than the previous bit line power consumption the comparison result makes the operating unit to deactivate.

In one embodiment, the bit line discharge oscillator further comprises a logic unit; and a plurality of bit line discharge units, coupled to the logic unit, wherein the bit line discharge units are serially connected, an input of the first bit line discharge unit is coupled to an output of the logic unit and an output of the final bit line discharge unit is fedback to an input of the logic unit. In one embodiment, the logic unit comprises an XOR gate. In one embodiment, the first pulse corresponds to an average read current related to the average threshold voltage and the second pulse corresponds to the minimum read current related to the worst threshold voltage.

In one embodiment, the bit line discharge unit further comprises a memory cell having a word line and a bit line; a buffer, coupled between the word line and an input of the bit line discharge unit; an inverter, coupled between the bit line and an output of the bit line discharge unit; a transistor, coupled between the bit line and the input of the bit line discharge unit, for pre-charging the bit line; and a bit line load, coupled to the bit line.

In still another embodiment, a bit line power optimizing method for memory cells is provided. The method can be executed by a computing system. The method comprises steps of obtaining a word line turn-on time corresponding to a worst bit among the memory cells, wherein a minimum offset voltage is satisfied during the word line turn-on time; obtaining an average offset voltage based on the word line turn-on time, wherein the average offset voltage is a function of the supply voltage; obtaining a bit line power consumption from the average offset voltage and the supply voltage; plotting a diagram of the bit line power consumption versus and the supply voltage according to a condition of the manufacturing process; obtaining a target supply voltage at a reverse point where the bit line power consumption versus is minimum; and outputting the target supply voltage and obtaining an optimized power consumption corresponding to the target supply voltage.

In one embodiment, the average offset voltage can be further a function of the supply voltage and a threshold voltage. In addition, the condition of the manufacturing process can be temperature, threshold voltage or a combination thereof.

To make the above features and advantages of the disclosure more comprehensible, several embodiments accompanied with drawings are described in detail as follows.

DESCRIPTION OF THE EMBODIMENTS

In the embodiment, a suitable mathematical model capable of simulating and optimizing the bit line (BL) power consumption for the advanced process or others is first derived and explained. Then, a corresponding method and a circuit or system are provided for implementing the power optimization scheme.

Figure 1A:
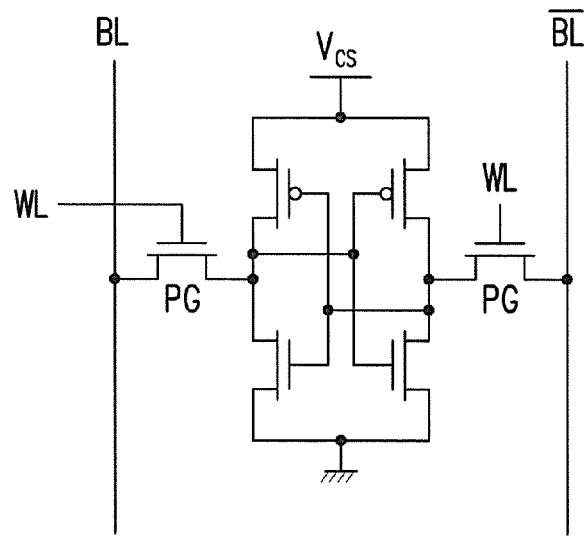
FIG. 1A shows an ordinarily exemplary structure of 6-transistor SRAM.
Figure 1B:
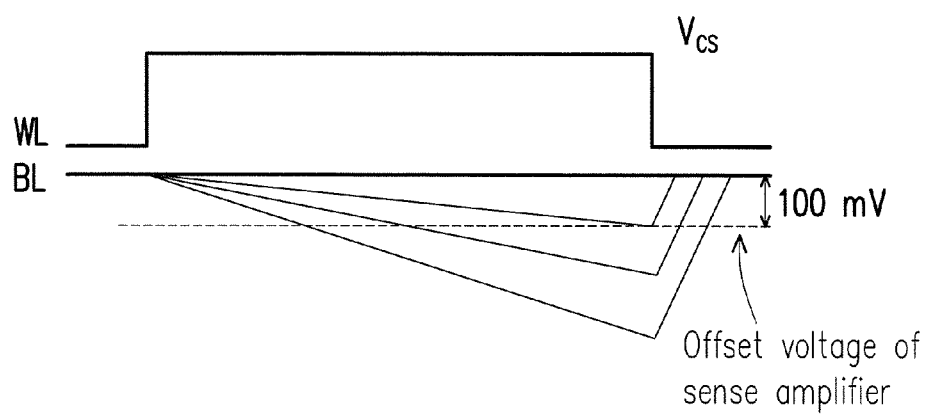
FIG. 1B shows an exemplary bit line discharge patterns.
Figure 1C:
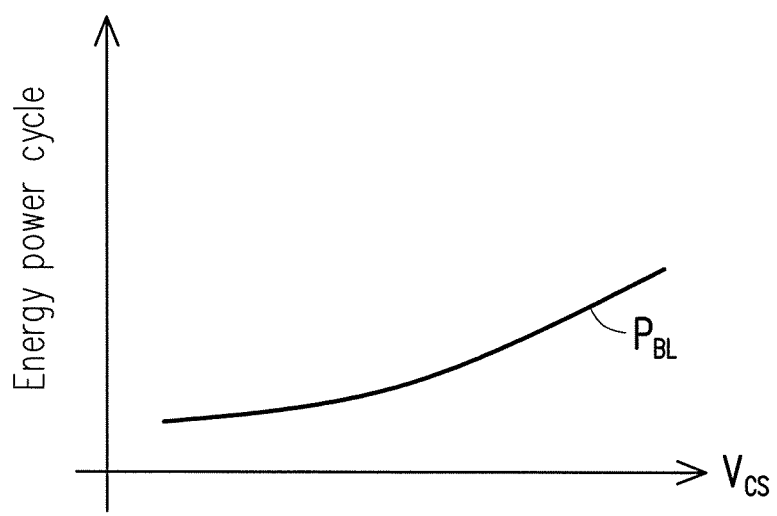
FIG. 1C illustrates a relationship between the energy and the supply voltage to the memory cell.
Figure 2:
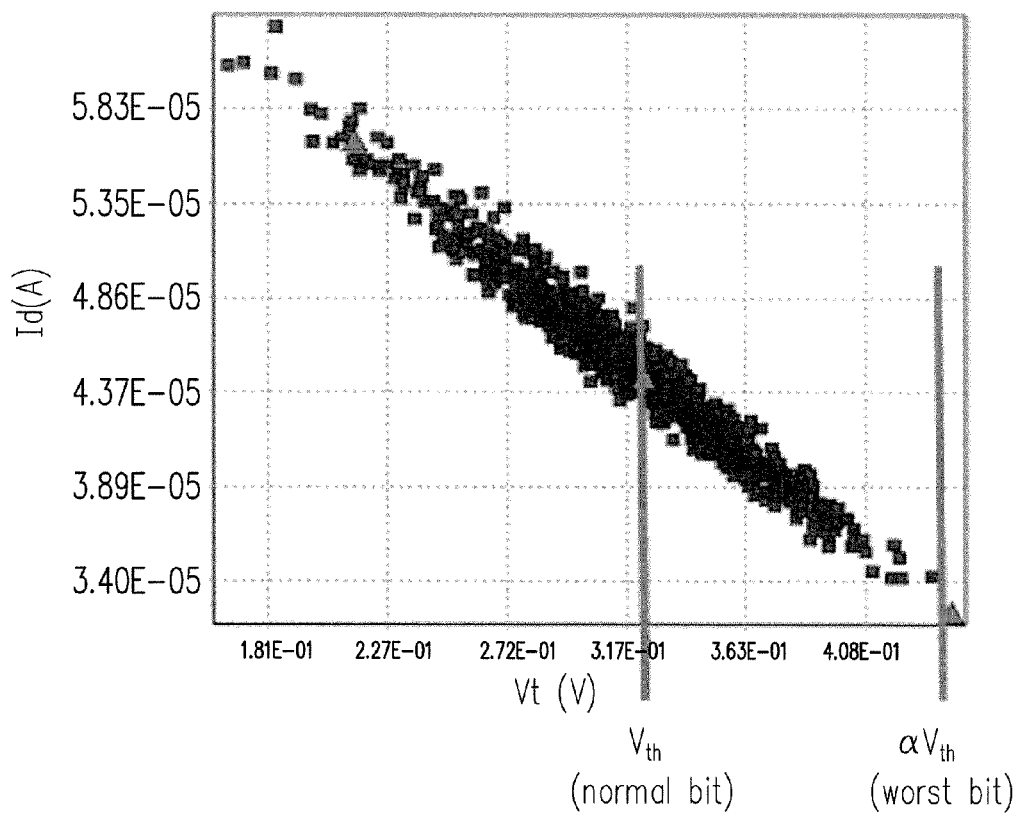
FIG. 2 shows a threshold voltage ($V_{th}$) distribution diagram for a passing gate of a 6T SRAM.

FIG. 2 shows a threshold voltage ($V_{th}$) distribution diagram (current Id vs threshold voltage) for a passing gate (PG) of a 6T SRAM, and the 6T SRAM is made by a manufacturing process, for example, "UMC 40LP 6T240(PG)" developed by the applicant. This distribution is taken as an example for following descriptions. In FIG. 2, the threshold voltage distribution of the passing gates shows a random variation or mismatch for bit cells. From the distribution diagram of FIG. 2, one can find the average threshold is $V_{th}$, the threshold voltage of the worst bits depicted at downright corner is $\alpha V_{th}$.

The read current $I_{read}$, BL capacitance $C_{BL}$, WL turn-on time $T_{WL}$ and $\Delta V_{BL}$ can be expressed as the following expression (2).

$$\Delta V_{BL} = \frac{I_{read} \times T_{WL}}{C_{BL}} \qquad (2)$$

In the expression (2), if assuming the transistor serving as the passing gate is a MOS transistor, the current-voltage relationship can be expresses by $k(V_{CS}-V_{th})^2 V_{CS}$. Then, the offset voltage $\Delta V_{BL}$ can be further reformulated as follows.

$$\Delta V_{BL} = \frac{k(V_{CS} - V_{th})^2 V_{CS} \times T_{WL}}{C_{BL}} \qquad (3)$$

Figure 3A:
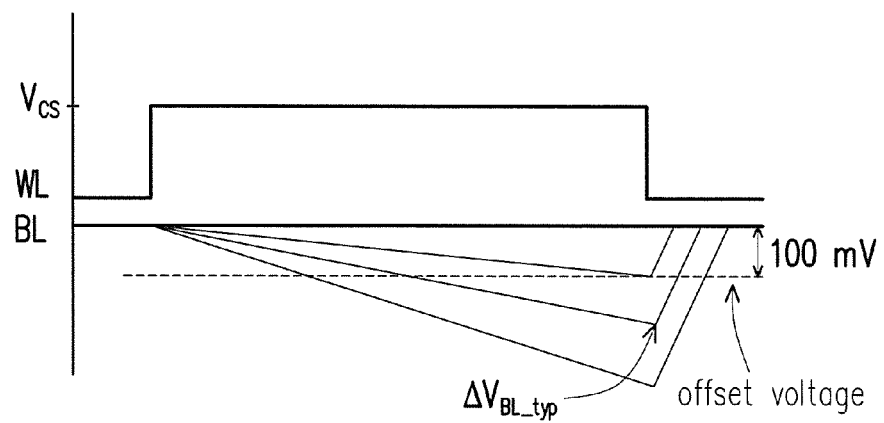
FIG. 3A shows an exemplary bit line discharge patterns.
Figure 3B:
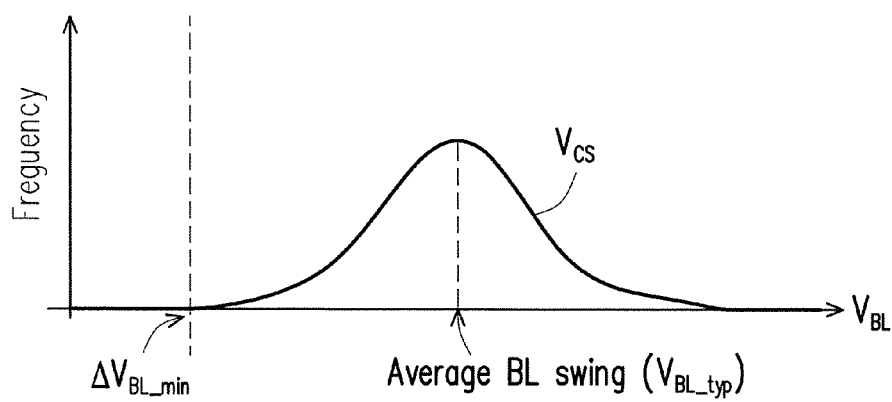
FIG. 3B shows a distribution of frequency versus offset voltage.

Considering the worst bits, the worst bit usually has a corresponding minimum read current. Referring to FIGS. 3A and 3B, for reading all cells, the WL turn-on time $T_{WL}$ has to be sufficient long to ensure that the worst bit can reach the minimum preset offset voltage $\Delta V_{BL\_min}$, i.e., 100 mV in this example. Therefore, during the WL turn-on time $T_{WL}$, the offset voltage $\Delta V_{BL}$ must be equal to or large than 100 mV for distinguishing the stored bit value. For the worst bit, the minimum preset offset voltage $\Delta V_{BL}$, can be written as following expression (4).

$$\Delta V_{BL\_min} = V_{SA} = \frac{I_{read\_min} \times T_{WL}}{C_{BL}} = 100 \text{ mV} \qquad (4)$$

Using the relationship showing in the expression (3), a following expression (5) can be obtained by rearranging the expression (4), in which the threshold voltage for the worst bit is $\alpha V_{th}$.

$$k(V_{CS}-\alpha V_{th})^2 V_{CS} \times T_{WL}=100 C_{BL} \qquad (5)$$

Then, considering the normal bits or the average BL swing (i.e., the typical value in the random variation shown in FIG. 2), the average offset voltage $\Delta V_{BL\_typ}$ during the same WL turn-on time $T_{WL}$ can be expressed as following expression (6).

$$\Delta V_{BL\_typ} = V_{SA} = \frac{I_{read\_typ}}{C_{BL}} = \frac{k(V_{CS} - V_{th})^2 V_{CS} \times T_{WL}}{C_{BL}} \qquad (6)$$

Combing the expressions (5) and (6), the average offset voltage (BL swing) $\Delta V_{BL\_typ}$ can be expressed by following expression (7) as a function of the supply voltage $V_{CS}$ and the threshold voltage $V_{th}$.

$$\Delta V_{BL\_typ} = 100 \times \left(\frac{V_{CS} - V_{th}}{V_{CS} - \alpha V_{th}}\right)^2 \qquad (7)$$

In addition, from the expression (1), it can be concluded as following expression (8) that the bit line power consumption $E_{BL}$ is proportional to $\Delta V_{BL} \times V_{CS}$, in which the offset voltage $\Delta V_{BL}$ is no longer a constant, but a variable.

$$E_{BL}=C_{BL} \times \Delta V_{BL} \times \Delta V_{CS} \propto \Delta V_{BL} \times V_{CS} \qquad (8)$$

Then, combing the expressions (7) and (8), following expression (9) can be obtained.

$$E_{BL} = \propto 100 \times \left(\frac{V_{CS} - V_{th}}{V_{CS} - \alpha V_{th}}\right)^2 \times V_{CS} \qquad (9)$$

From the expression (9), it can understand how the power consumption (energy) $E_{BL}$ of bit line is varied with the threshold voltage $V_{th}$ and $V_{CS}$. In the expression (9), the constant "100", the supply voltage $V_{CS}$ and the coefficient $\alpha$ are dependent on the manufacturing process.

According to the expression (9), the power consumption $E_{BL}$ at different supply voltage $V_{CS}$ can be obtained. For example, the power consumptions $E_{BL}$ at a high supply voltage $V_{CS1}$ and high supply voltage $V_{CS2}$ can be represented respectively by following expressions (10) and (11).

$$E_{BL1} \propto 100 \times \left(\frac{V_{CS1} - V_{th}}{V_{CS1} - \alpha V_{th}}\right)^2 \times V_{CS1} \qquad (10)$$

$$E_{BL2} \propto 100 \times \left(\frac{V_{CS2} - V_{th}}{V_{CS2} - \alpha V_{th}}\right)^2 \times V_{CS2} \qquad (11)$$

Figure 4:
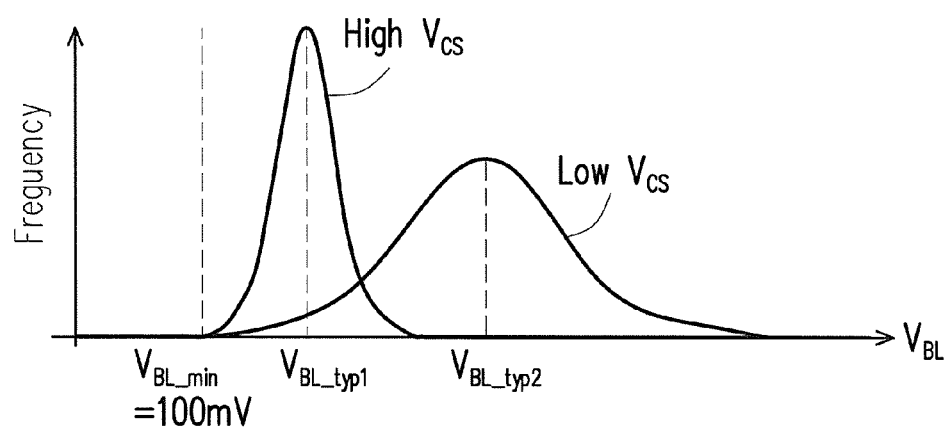
FIG. 4 shows a diagram of the power consumption versus the offset voltage at different supply voltage.

FIG. 4 shows a diagram of the power consumption versus the offset voltage at different supply voltage. As shown, even though the supply voltage $V_{CS2}$ is lower than the supply voltage $V_{CS1}$, the average offset voltage $\Delta V_{BL\_typ2}$ is not definitely lower than the average offset voltage $\Delta V_{BL\_typ2}$. Therefore, the average offset voltage $\Delta V_{BL}$ is not a constant. In the embodiment, the power consumption $E_{BL}$ is optimized based on the above expression (9).

Figure 5:
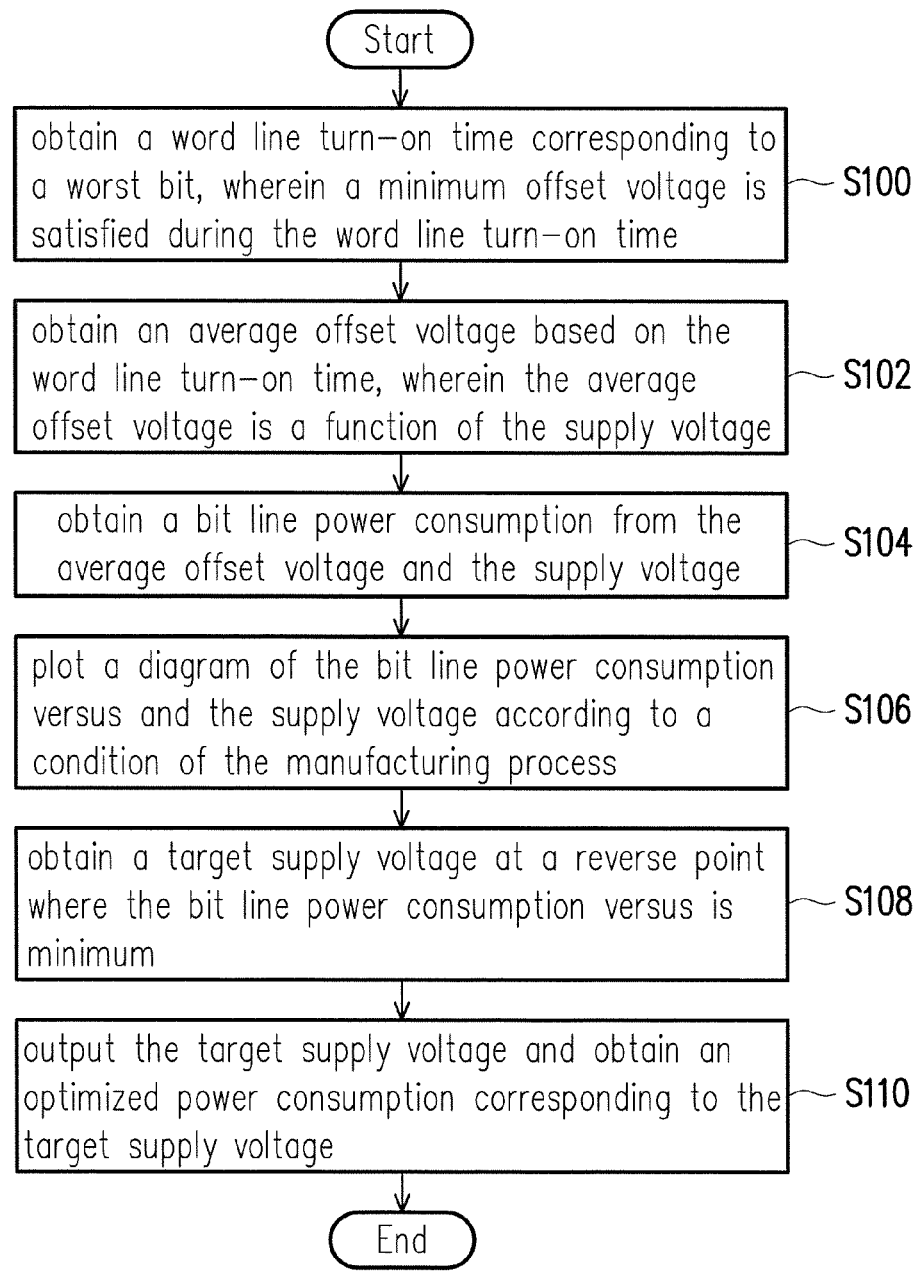
FIG. 5 is a flow chart showing a method for optimizing a bit line power.

Next, a method, a circuit or a system for implementing bit line power optimization is described in detail. FIG. 5 is a flow chart showing a method for optimizing a bit line power. With reference to FIG. 5 and aforementioned expressions (2)-(9), the method for optimizing a bit line power is described further in detail. The optimization can be executed for example in a computing system, or any hardware. In step S100, a word line turn-on time $T_{WL}$ corresponding to a worst bit, wherein a minimum offset voltage $\Delta V_{BL\_min}$ is satisfied during the word line turn-on time $T_{WL}$.

In step S102, an average offset voltage $\Delta V_{BL\_typ}$ (i.e., the average BL swing in FIG. 3B) is obtained based on the word line turn-on time $T_{WL}$, wherein the average offset voltage is a function of the supply voltage $V_{CS}$. For example, according to the above expressions (5) and (6), the average offset voltage $\Delta V_{BL\_typ}$ can be obtained to be a function of the supply voltage $V_{CS}$ and the threshold voltage $V_{th}$, for example as shown in the above expression (7). In the expression (6), the average offset voltage $\Delta V_{BL\_typ}$ is a function of the threshold voltage $V_{th}$ and the supply voltage $V_{CS}$. But, for each one simulation, once a particular manufacturing process is selected, the threshold voltage $V_{th}$ can be referred as a constant, i.e., the factor of threshold voltage is determined according to the selected manufacturing process. Therefore, for a determined manufacturing process, the average offset voltage $\Delta V_{BL\_typ}$ can be referred as a function of and the supply voltage $V_{CS}$.

In step S104, a bit line power consumption $E_{BL}$ is obtained from the average offset voltage $\Delta V_{BL\_typ}$ and the supply voltage $V_{CS}$. For example, according to the above expression (8), the bit line power consumption $E_{BL}$ is $\Delta V_{BL} \times V_{CS}$. Then, the bit line power consumption $E_{BL}$ is obtained in the form of the above expression (9).

In step S106, a diagram of the bit line power consumption $E_{BL}$ versus and the supply voltage $V_{CS}$ is plotted according to a condition of the manufacturing process. Followings depict some examples of the plotted diagrams.

Figure 6A:
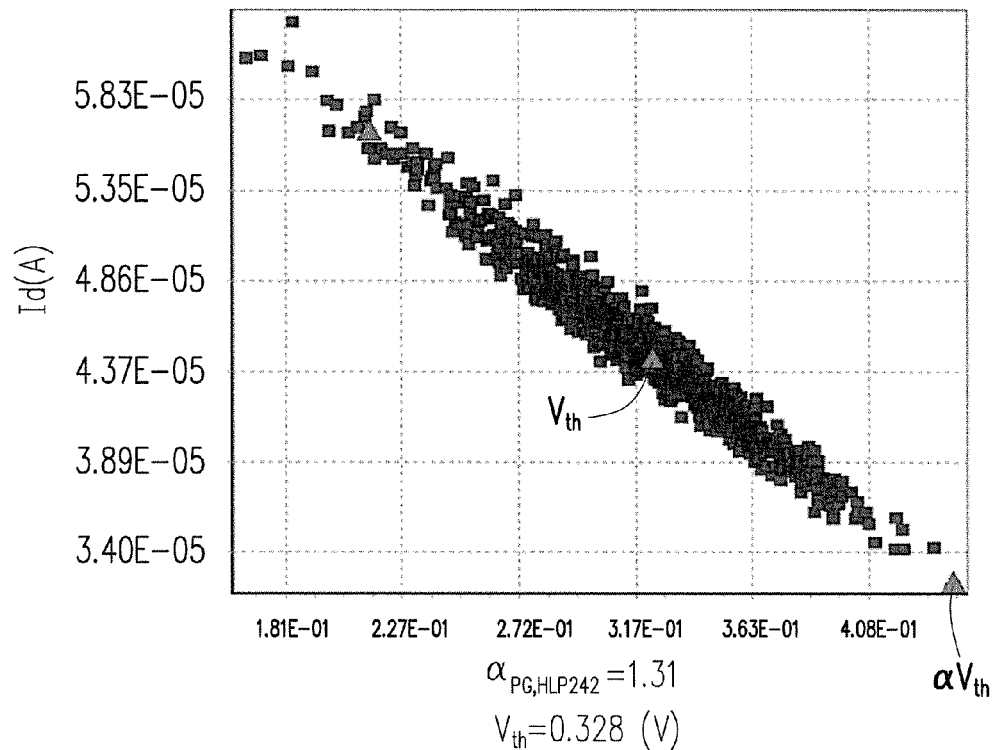
FIGS. 6A-6D illustrate exemplary simulation results according to the embodiment of the invention.
Figure 6B:
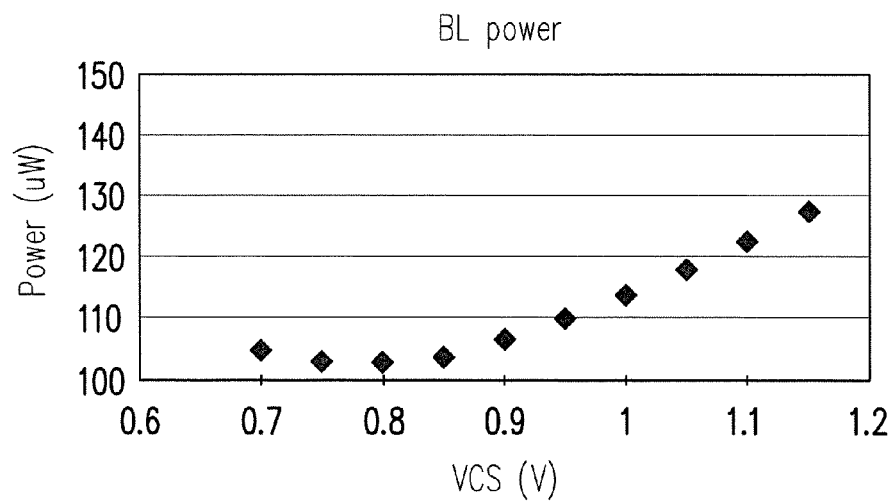
Figure 6C:
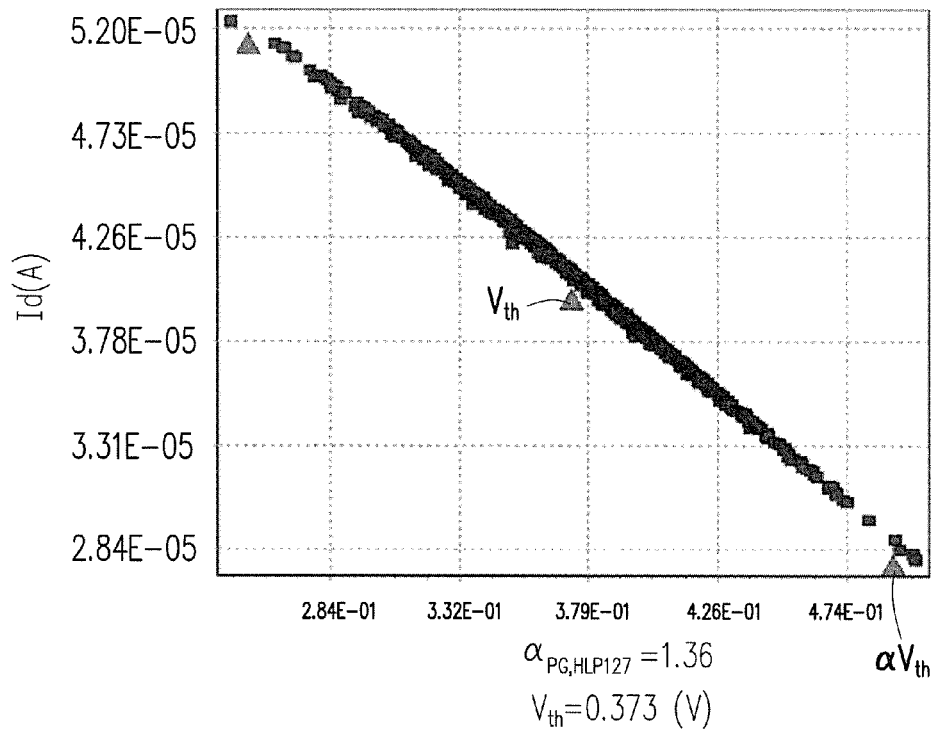
Figure 6D:
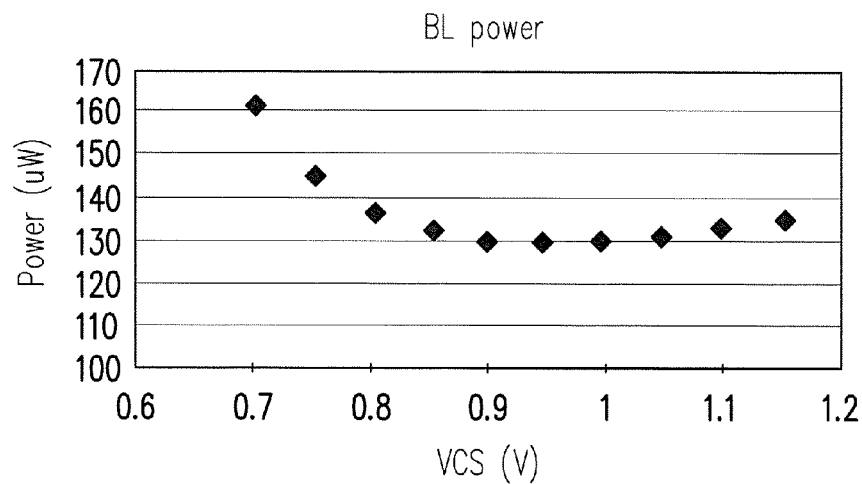

FIGS. 6A-6D illustrate exemplary simulation results according to the embodiment of the invention. FIG. 6A shows an exemplary process of 40LP 6T240(PG) developed by the applicant, in which the threshold voltage $V_{th}$ is 0.328V, and $\alpha$ is 1.31. In this condition of the manufacturing process, the bit line power consumption versus the supply voltage $V_{CS}$ is plotted in FIG. 6B. In another example as shown in FIGS. 6C and 6D, the bit line power consumption versus the supply voltage $V_{CS}$ is plotted in FIG. 6D in which an exemplary process (28HLP 6T 127(PG) developed by the applicant, shown in FIG. 6C) that the threshold voltage $V_{th}$ is 0.373V, and $\alpha$ is 1.36.

Figure 7A:
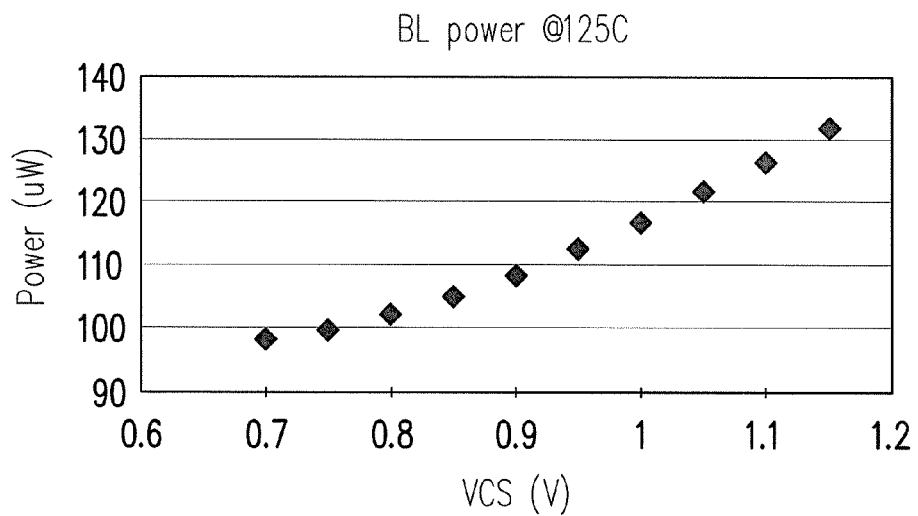
FIGS. 7A and 7B illustrate another exemplary simulation results according to the embodiment of the invention.
Figure 7B:
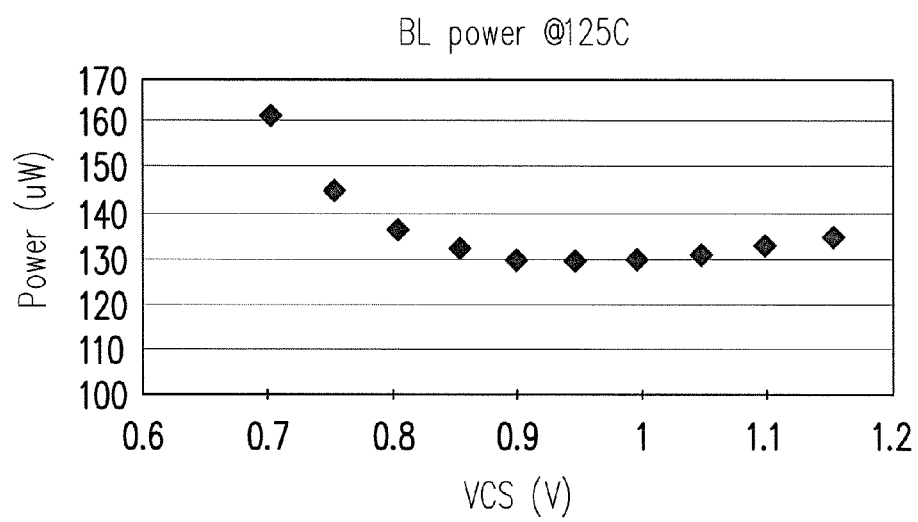

FIGS. 7A and 7B illustrate exemplary simulation results according to the embodiment of the invention. The simulation is made by an exemplary process "28HLP 6T 127(PG)" developed by the applicant. the process condition is that the temperature is 125° C., the threshold voltage is 0.283V, and $\alpha$ is 1.36 in FIG. 7A, and that the temperature is 25° C., the threshold voltage is 0.373V, and $\alpha$ is 1.36 in FIG. 7B.

Figure 8A:
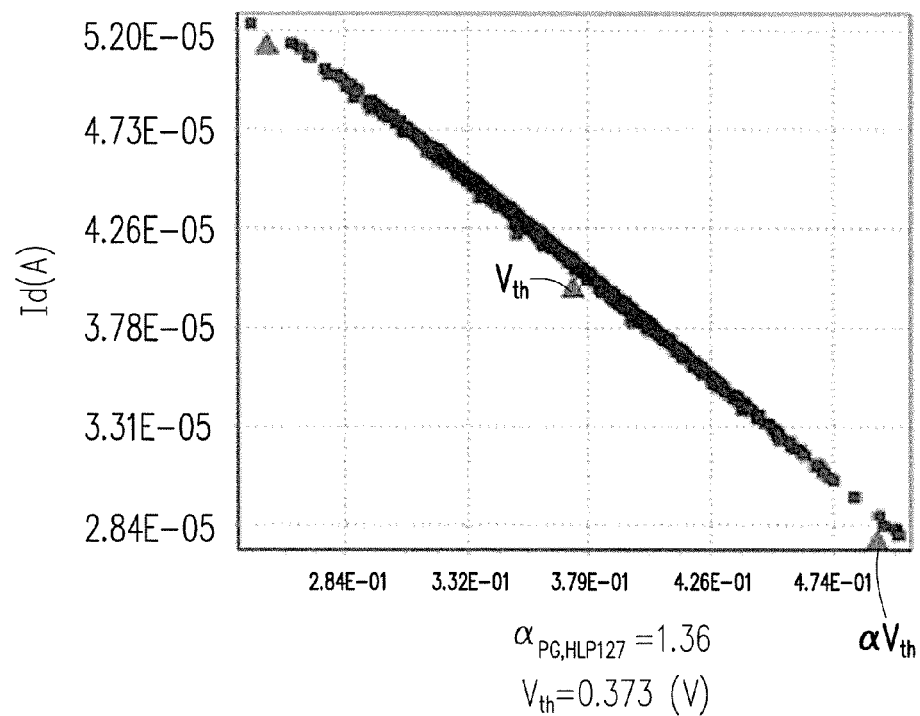
FIGS. 8A to 8C illustrate still another exemplary simulation results according to the embodiment of the invention.
Figure 8B:
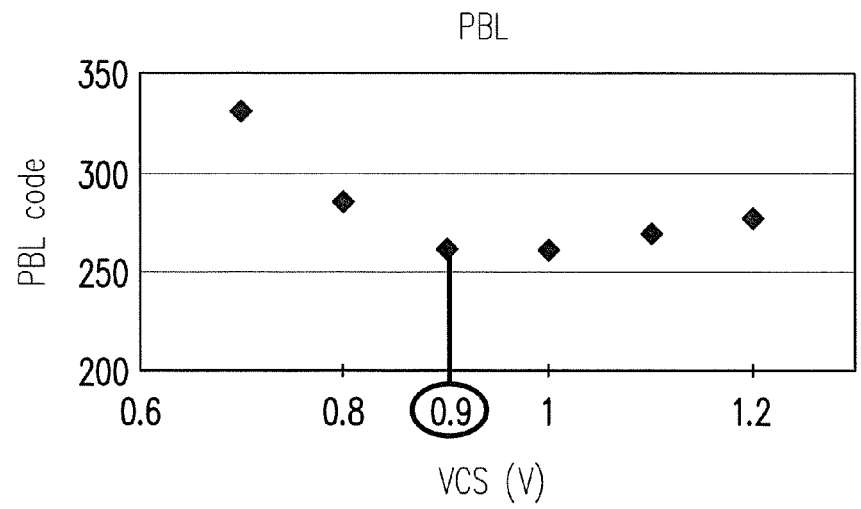
Figure 8C:
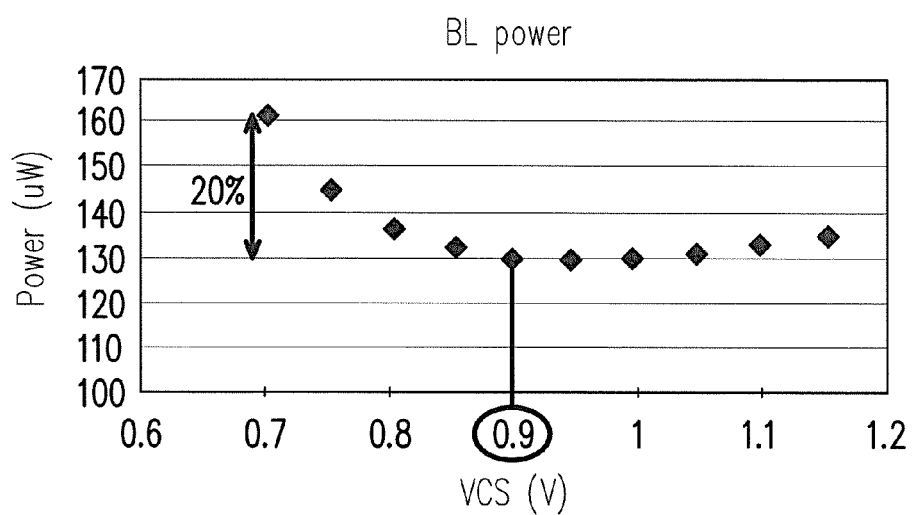

In step S108, a target supply voltage at a reverse point of where the bit line power consumption versus is minimum is obtained. Then, in step S110, the target supply voltage is outputted so as to obtain an optimized power consumption corresponding to the target supply voltage. For example, referring to FIGS. 6B and 6D, the reverse points of the supply voltages are 0.8V and 0.85V respectively. In addition, the reverse points of the supply voltage is about 0.9V in FIG. 7B. Therefore, following the optimization method of the invention, the optimized supply voltage can be found and fulfilled the advanced process. As shown in FIG. 8C, the optimized supply voltage is 0.9, and the power can be reduced by about 20%.

Figure 9:
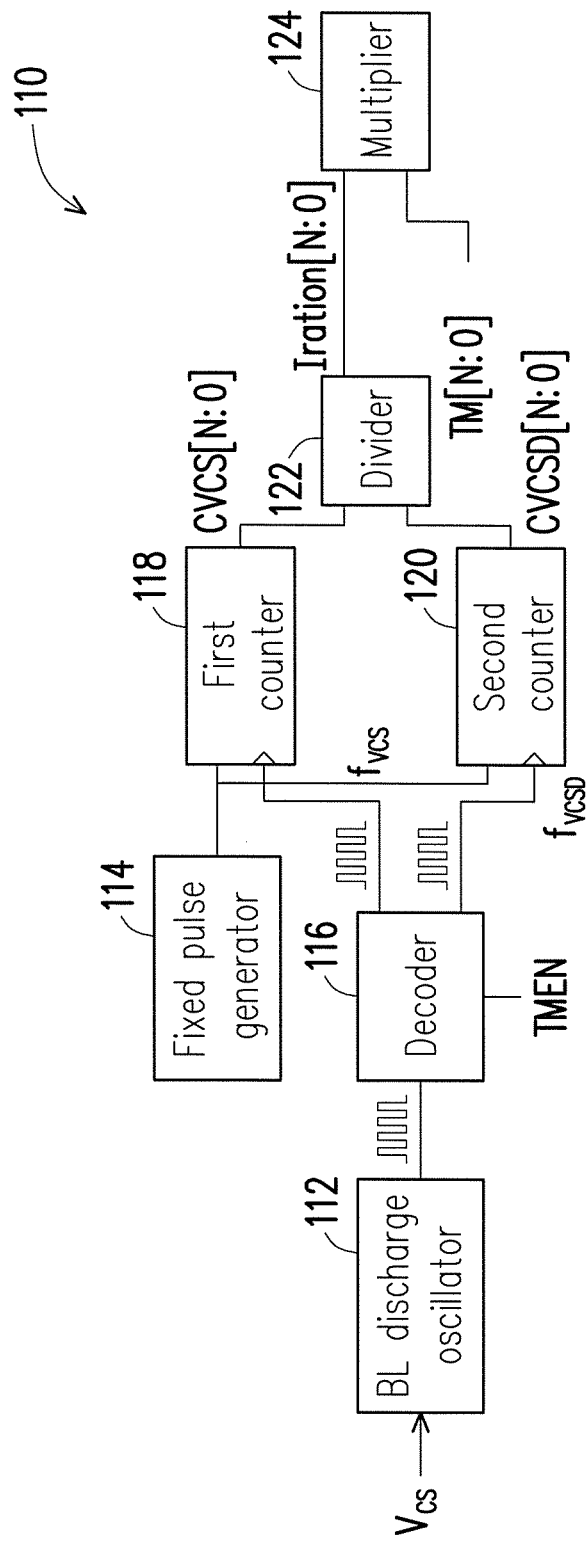
FIG. 9 is a circuit diagram for implementing bit line power.

Next, a circuit for implementing the above method is described in details. FIG. 9 is a circuit diagram for implementing bit line power. As shown, the BL power implementing circuit 110 comprises a bit line discharge oscillator 112, a fixed pulse generator 114, a decoder 116, a first counter 118, a second counter 120, a divider 122 and a multiplier 124. The bit line discharge oscillator 112 receives a supply voltage $V_{CS}$, and generates a pulse. The decoder 116 is coupled to the bit line discharge oscillator 112 for decoding pulse. Then, the decoder 116 provides a first pulse with a first frequency $f_{VCS}$ and a second pulse with a second frequency $f_{VCSD}$. The first pulse corresponds to an average read current related to the average threshold voltage $V_{th}$ for normal bits and the second pulse corresponds to the minimum read current related to the worst threshold voltage $\alpha V_{th}$, for worst bits (referring to FIG. 2).

The first counter 118 and the second counter 120 are coupled to the output of decoder 116, and generates signals respectively proportional to the minimum read current $I_{read\_min}$ (i.e., $k(V_{CS}-\alpha V_{th})^2 V_{CS}$) and the average read current $I_{read\_typ}$ (i.e., $k(V_{CS}-V_{th})^2 V_{CS}$). The fixed pulse generator 114 provides a fixed pulse to the first counter 118 and the second counter 120. The divider 122 receives the outputs of the first counter 118 and the second counter 120, and outputs a read current ratio $I_{ratio}$ of $I_{read\_typ}/I_{read\_min}$ (i.e., $k(V_{CS}-V_{th})^2/k(V_{CS}-\alpha V_{th})^2$). The multiplier 124 is coupled to the output of the divider 122, receives the current ratio $I_{ratio}$ and the supply voltage $V_{CS}$, and outputs a product of two inputs. Namely, the BL power implementing circuit 110 converts the inputted supply voltage to a digital code that is proportion to the bit line power consumption $E_{BL}$.

Next, the detail operation of the BL power implementing circuit 110 is further described. In order to implementing bit line power consumption $E_{BL}$ by a circuit, the bit line power consumption $E_{BL}$ in the expression (9) is further rearranged to the following expression (12).

$$E_{BL} \propto \left(\frac{V_{CS} - V_{th}}{V_{CS} - \alpha V_{th}}\right)^2 \times V_{CS} = \frac{(V_{CS} - V_{th})^2}{[(V_{CS} - (\alpha - 1)V_{th}) - V_{th}]^2} \times V_{CS} \qquad (12)$$

The term $V_{CS}-(\alpha-1)V_{th}$ defined as $V_{CSD}$, and the expression (12) is simplified as following expression (13).

$$E_{BL} \propto \left(\frac{V_{CS} - V_{th}}{V_{CS} - \alpha V_{th}}\right)^2 \times V_{CS} = \frac{(V_{CS} - V_{th})^2}{(V_{CSD} - V_{th})^2} \times V_{CS} \quad (13)$$

Usually, the voltage $V_{CSD}$ is smaller than $V_{CS}$, which can reflect the coefficient $\alpha$. Generally, the voltage $V_{CSD}$ can be calculated by subtracting the supply voltage $V_{CS}$ with an amount that is obtained from a test key of a selected manufacturing process. This amount can be picked up from a look-up table or inputted by manually.

In addition, digital codes CVCS [N:0] and CVCSD [N:0] are further defined as following expressions (14) and (15).

$$CVCS[N:0] \propto f_{VCS} \propto (V_{CS} - V_{th})^2 \quad (14)$$

$$CVCSD[N:0] \propto f_{VCSD} \propto (V_{CSD} - \alpha V_{th})^2 \quad (15)$$

In this circuit as shown in FIG. 9, the BL discharge oscillator 112 is designed to generate a pulse with frequency proportional to the read current, which will be explained in detail with reference to FIGS. 10A-10C.

In operation, for example the BL discharge oscillator 112 generates a pulse with frequency $f_{VCS}$. As the decoder 116 receives the pulse with frequency $f_{VCS}$, the decoder 116 selects a route to the first counter 118 to count the pulse to generate the digital code CVCS [N:0]. Next, in order to generate the digital code CVCSD [N:0], a test mode signal is inputted to the decoder 116. Once receiving the test mode signal, the decoder 116 begins to receive the pulse with frequency $f_{VCSD}$, the decoder 116 selects another route to the second counter 120 to count the pulse to generate the digital code CVCSD [N:0]. For example, the test mode signal can be a clock signal with a longer period, and the decoder 116 processes the pulse with frequency $f_{VCS}$ during the ON period and the pulse with frequency $f_{VCSD}$ during the OFF period.

After the first counter 118 counts the pulse with a frequency $f_{VCS}$ to generate a digital code CVCS [N:0] and second counter 120 counts the pulse with a frequency $f_{VCSD}$ to generate a digital code CVCSD [N:0], the divider 112 receives the digital code CVCS [N:0] and the digital code CVCSD [N:0] and then divides the digital code CVCS [N:0] by the digital code CVCSD [N:0] to generates a current ratio code $I_{ratio}$ [N:0]. Namely, the divider 112 outputs current ratio $I_{ratio}$ represented by the following expression (16).

$$I_{ratio}[N:0] \propto \frac{CVCS[N:0]}{CVCSD[N:0]} \propto \left(\frac{V_{CS} - V_{th}}{V_{CS} - \alpha V_{th}}\right)^2 \quad (16)$$

Next, the multiplier 124 receives the current ratio $I_{ratio}$ and the supply voltage $V_{CS}$, both of which are represented by current ratio code $I_{ratio}$ [N:0] and voltage code TM [N:0] (where TM [N:0] is proportional to $V_{CS}$). Then, in the following expression (17), the multiplier 124 outputs a digital code PBL [N:0] that is proportional to the bit line power consumption $E_{BL}$.

$$PBL[N:0] \propto \left(\frac{V_{CS} - V_{th}}{V_{CS} - \alpha V_{th}}\right)^2 \times V_{CS} \propto E_{BL} \quad (17)$$

Therefore, according to the circuit shown in FIG. 9, when receiving a supply voltage $V_{CS}$, the BL power implementing circuit 110 generates the digital code PBL [N:0] that is proportional to the bit line power consumption $E_{BL}$. And corresponding to the supply voltage $V_{CS}$.

Figure 10A:
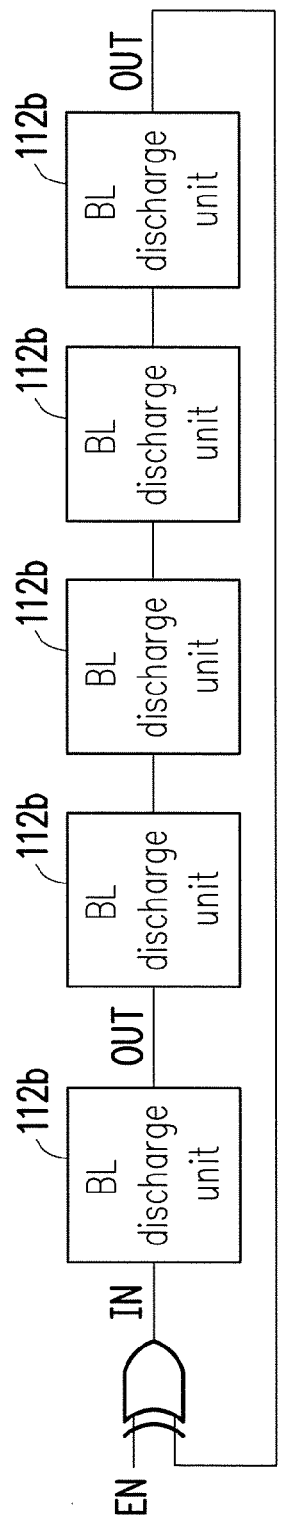
FIG. 10A shows an exemplary circuit for the bit line discharge oscillator shown in FIG. 9.

FIG. 10A shows an exemplary circuit for the bit line discharge oscillator 112 shown in FIG. 9. As shown in FIG. 10A, the bit line discharge oscillator 112 comprise a logic unit 112a and a plurality of bit line discharge units 112b. The bit line discharge units 112b are serially connected, in which an input of the first bit line discharge unit 112b is coupled to an output of the logic unit 112a and an output of the final bit line discharge unit 112b is fedback to an input of the logic unit 112a. The logic unit 112a, for example, can be an XOR gate, but not a limitation to the application. Any one skilled in this art can select a suitable logic gate based on demands. In this embodiment, the XOR gate 112a can further receive an enable signal EN for activating the operation of the bit line discharge oscillator 112.

Figure 10B:
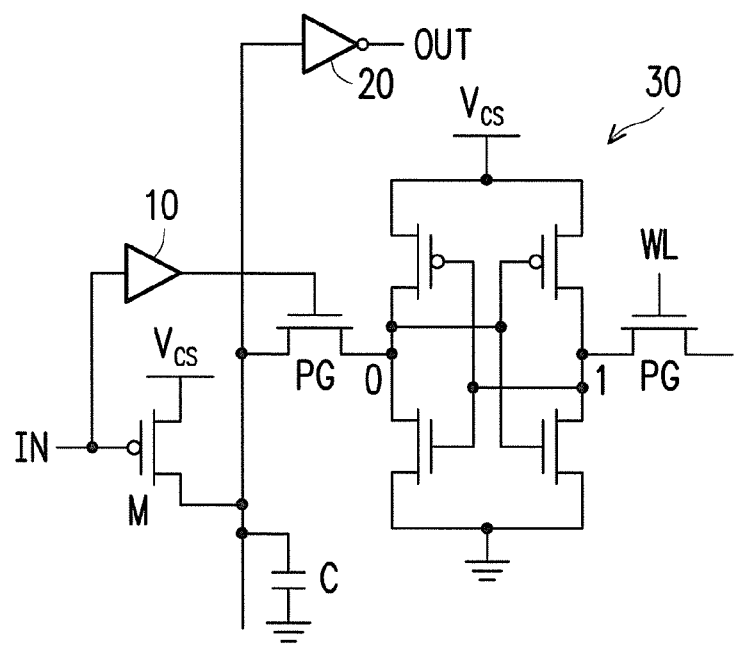
FIG. 10B shows an exemplary circuit for the bit line discharge unit shown in FIG. 10A.
Figure 10C:
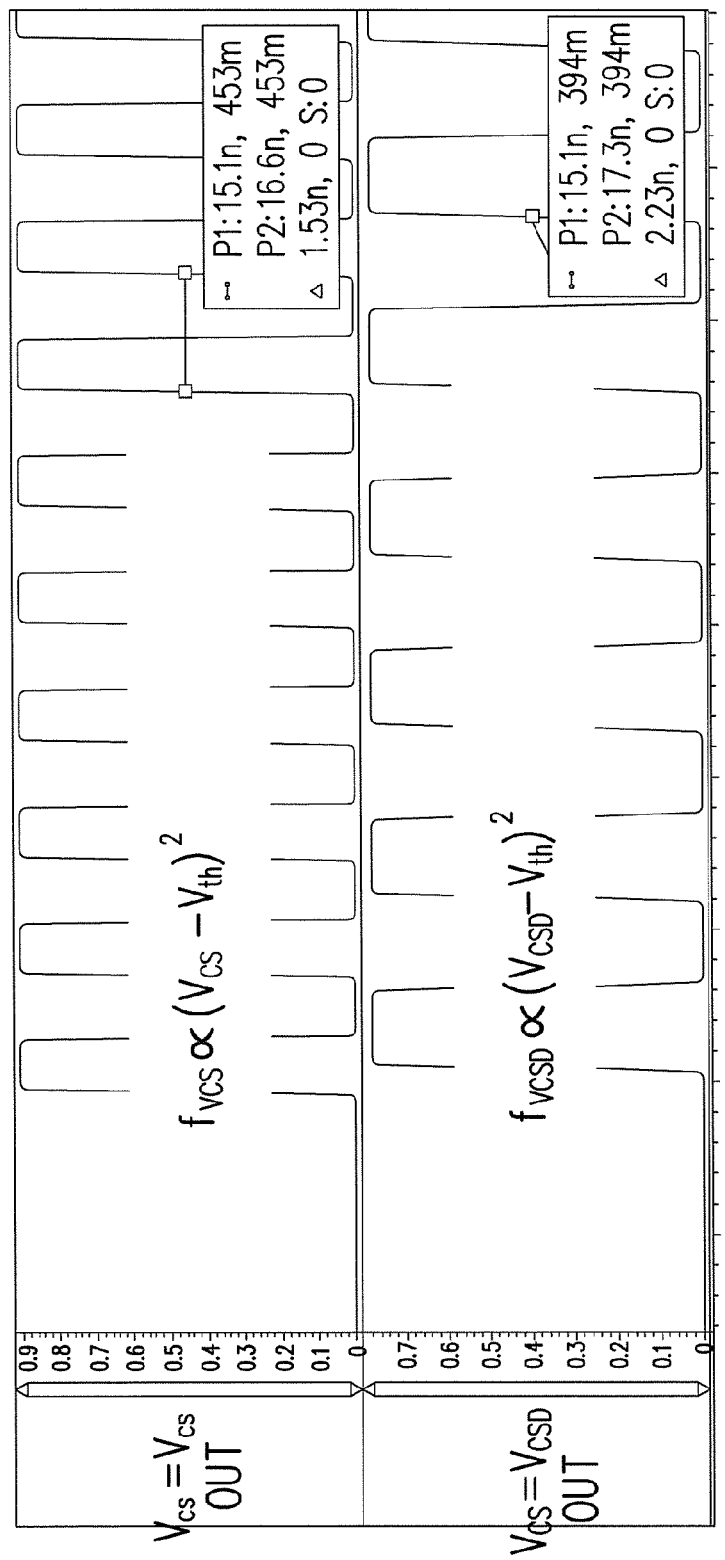
FIG. 10C shows pulses generated by the bit line discharge oscillator.

FIG. 10B shows an exemplary circuit for each bit line discharge unit 112b. Basically, each of the bit line discharge unit 112b is configured to have a circuit structure similar or same with the SRAM cell to be simulated, and thus the bit line discharge unit 112b is configured to a 6T SRAM configuration according to the exemplary embodiment.

As shown in FIG. 10B, the bit line discharge unit 112b comprises a memory cell 30, a buffer 10, an inverter 20, a transistor M and a bit line load C. In the embodiment, the memory cell 30 is a 6T SRAM, in which bit values 0 and 1 are previously stored. The memory cell 30 has a word line WL and a bit line BL. The buffer 10 is coupled between the word line WL and an input IN of the bit line discharge unit 112b. The inverter 20 is coupled between the bit line BL and an output of the bit line discharge unit 112b. The transistor is coupled between the bit line BL and the input IN of the bit line discharge unit, for pre-charging the bit line. The bit line load, i.e., a capacitor, is coupled to the bit line BT. FIG. 10C shows waveforms of the $(V_{CS}-V_{th})^2$ and $(V_{CSD}-\alpha V_{th})^2$. Therefore, by the proposed circuit, pulses with frequencies $f_{VCS}$ and $f_{VCSD}$ can be generated to represent the read current.

Following is a simulation result. As listed in TABLE 1, stages of the BL discharge units 112b can be set to be larger 21 because the variation can be smaller than ±10. The suitable stages of the BL discharge units 112b can be properly set according to the selected manufacturing process.

TABLE 1

| BL osc variation | 11 stage | 21 stage | 31 stage | 41 stage | 51 stage | 61 stage | 71 stage | 81 stage | 91 stage | 101 stage | 111 stage |
|---|---|---|---|---|---|---|---|---|---|---|---|
| TT_NVNT | 30.51% | 22.08% | 18.17% | 15.80% | 14.17% | 12.95% | 12.01% | 11.24% | 10.61% | 10.07% | 9.60% |
| FF_NVNT | 28.75% | 20.80% | 17.12% | 14.89% | 13.35% | 12.21% | 11.31% | 10.59% | 9.99% | 9.49% | 9.05% |
| SS_NVNT | 31.54% | 22.83% | 18.79% | 16.34% | 14.65% | 13.39% | 12.41% | 11.62% | 10.97% | 10.41% | 9.93% |

Figure 11:
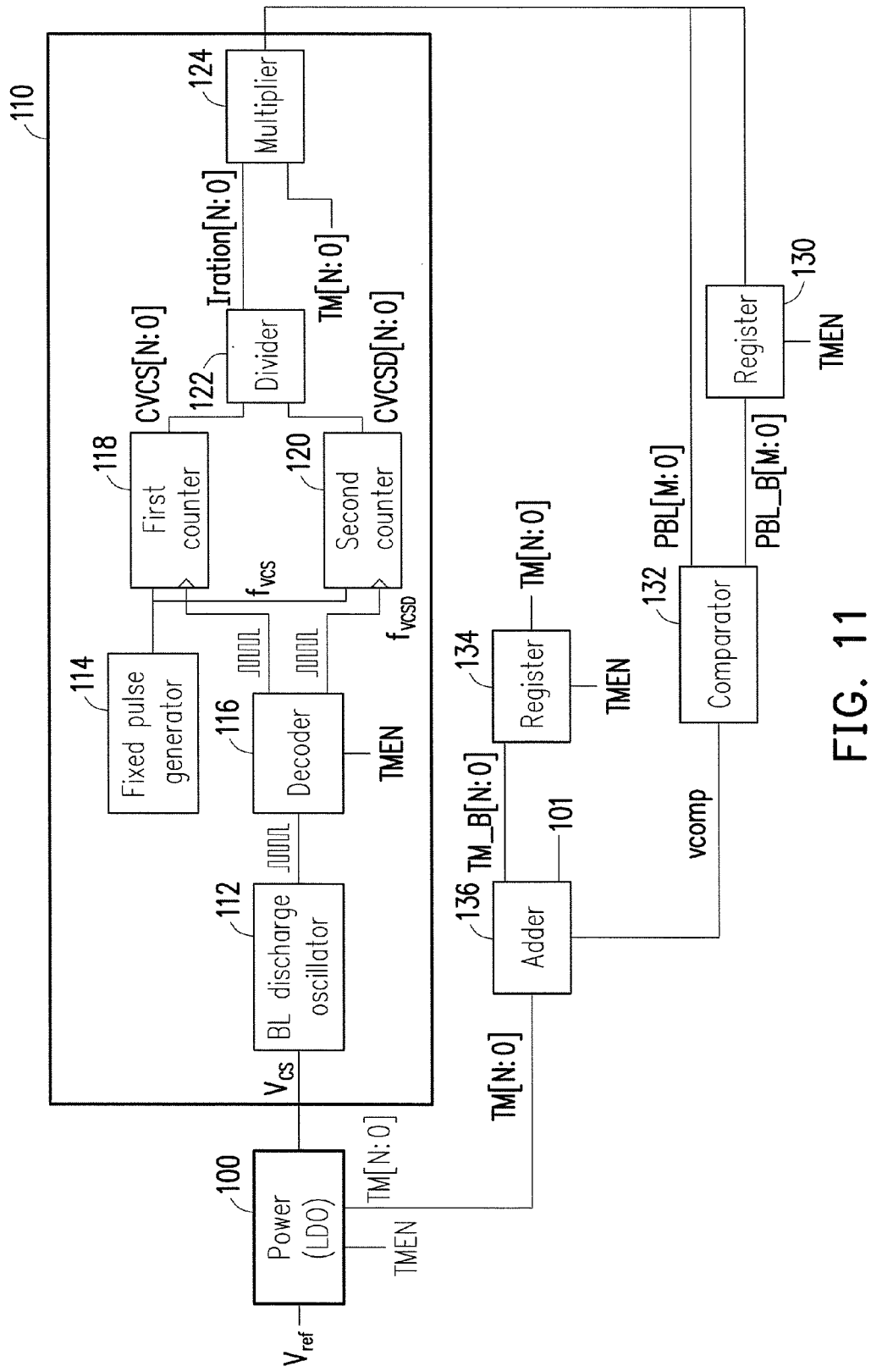
FIG. 11 illustrates a circuit for optimizing the bit line power consumption.

FIG. 11 illustrates a circuit for optimizing the bit line power consumption. As shown in FIG. 11, the circuit comprises a power source 100, a BL power implementing circuit 110, a first register 130, a comparator 132, a second register 134 and an operating unit (for example, an adder) 136. The BL power implementing circuit 110 is the same as shown in FIG. 9, and thus its detail operation is omitted. In FIG. 11, the first register 130 receives and temporally stores the digital code PBL [N:0] outputted from the BL power implementing circuit 110. The comparator 132 is couple to the outputs of the first register 130 and the BL power implementing circuit 110 and performs a comparison between two supply voltages and outputs a comparison result Vcomp. The adder 136 is coupled between comparator 132 and the power source 100, and receives the comparison result Vcomp and an output of the second register 134. The first register 130, the comparator 132, the second register 134 and the adder 136, etc. are basically to perform the steps S106-S110 shown in FIG. 5.

In operation, usually a maximum supply voltage $V_{CS}$ is first inputted to the BL power implementing circuit 110 to generate a corresponding digital code PBL [N:0]. This code is then provides to the first register 130 and the comparator 132. Then, the power source 100 further inputs a next supply voltage, for example, $V_{CS}-\Delta V$. Then the BL power implementing circuit 110 generates another digital code corresponding to the supply voltage $V_{CS}-\Delta V$. Then, the comparator 132 compares the current PBL[M:0] and the previous PBL_B [M:0], and then outputs the comparison result Vcomp.

If the result represents that the current PBL[M:0] is smaller than the previous PBL_B [M:0], it means the power consumption has a descending trend. Then, the comparison result Vcomp is provided to the adder 136 to further add an amount to decrease the supply voltage $V_{CS}$. After the adder 136 provides the result to the power source 100, the power source 100 provides a next supply voltage, such as $V_{CS}-2\Delta V$ to the BL power implementing circuit 110.

The aforementioned procedure is continuously executed until the current power consumption begins larger than the previous power consumption. When this condition is satisfied, it means that the supply voltage reaches a reverse point, and the power consumption reaches its minimum value. Therefore, the proposed optimizing circuit can obtain a optimized supply voltage, and thus find the optimized bit line power consumption.

In summary, according to the embodiment of the method or the circuit for optimizing bit line power consumption, the offset voltage $\Delta V_{BL}$ is no longer a constant. The variation of e $\Delta V_{BL}$ due to the advanced process or process difference can be truly and precisely reflected. A suitable optimized bit line power can be efficiently and precisely obtained.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

What is claimed is:

1. A bit line power implementing circuit for memory cells having an average and a worst threshold voltages, comprising:
    a bit line discharge oscillator, receiving a supply voltage and converting the supply voltage to a pulse;
    a decoder, coupled to the bit line discharge oscillator to decode the pulse, and providing a first pulse with a first frequency and a second pulse with a second frequency;
    a first counter, coupled to the decoder, and receiving the first pulse with the first frequency, and outputting a signal proportional to the average read current;
    a second counter, coupled to the decoder, and receiving the first pulse with the first frequency, and outputting signal proportional to the minimum read current;
    a divider, coupled to the first and the second counters, and outputting a read current ratio of the average read current to the minimum read current; and
    a multiplier, coupled to the divider to multiply the supply voltage the read current ratio to output a bit line power consumption corresponding to the supply voltage.

2. The circuit of claim 1, wherein the first pulse corresponds to an average read current related to the average threshold voltage and the second pulse corresponds to the minimum read current related to the worst threshold voltage.

3. The circuit of claim 1, wherein the bit line discharge oscillator further comprises:
    a logic unit; and
    a plurality of bit line discharge units, coupled to the logic unit, wherein the bit line discharge units are serially connected, an input of the first bit line discharge unit is coupled to an output of the logic unit and an output of the final bit line discharge unit is fedback to an input of the logic unit.

4. The circuit of claim 3, wherein the logic unit comprises an XOR gate.

5. The circuit of claim 3, wherein the bit line discharge unit further comprises
    a memory cell having a word line and a bit line;
    a buffer, coupled between the word line and an input of the bit line discharge unit;
    an inverter, coupled between the bit line and an output of the bit line discharge unit;
    a transistor, coupled between the bit line and the input of the bit line discharge unit, for pre-charging the bit line; and
    a bit line load, coupled to the bit line.

6. The circuit of claim 5, wherein the memory cell is identical to a memory cell to be simulated.

7. The circuit of claim 6, wherein the memory cells are static random access memory (SRAM) cells.

8. A bit line power optimizing circuit for memory cells having an average and a worst threshold voltages, comprising:
    a bit line discharge oscillator, receiving a supply voltage and converting the supply voltage to a pulse;
    a decoder, coupled to the bit line discharge oscillator to decode the pulse, and providing a first pulse with a first frequency and a second pulse with a second frequency;
    a first counter, coupled to the decoder, and receiving the first pulse with the first frequency, and outputting a signal proportional to the average read current;
    a second counter, coupled to the decoder, and receiving the first pulse with the first frequency, and outputting signal proportional to the minimum read current;
    a divider, coupled to the first and the second counters, and outputting a read current ratio of the average read current to the minimum read current;
    a multiplier, coupled to the divider to multiply the supply voltage the read current ratio to output a bit line power consumption corresponding to the supply voltage;
    a power source, providing the supply voltage to the bit line discharge oscillator;
    a first register, coupled to the multiplier, for storing a previous bit line power consumption;
    a comparator, coupled to the multiplier and the first register, receiving a current bit line power consumption, for comparing the current and the previous bit line power consumptions, and outputting a comparison result;

a second register, for storing the supply voltage; and an operating unit, coupled to the second register and the comparator, for receiving the comparison result and perform an operation on the supply voltage, wherein when the current bit line power consumption is smaller than the previous bit line power consumption, the comparison result makes the operating unit to decreases the supply voltage by a preset amount, and provide the decreased supply voltage to the power source, and when the current bit line power consumption is larger than the previous bit line power consumption the comparison result makes the operating unit to deactivate.

9. The circuit of claim 8, wherein the first pulse corresponds to an average read current related to the average threshold voltage and the second pulse corresponds to the minimum read current related to the worst threshold voltage.

10. The circuit of claim 8, wherein the bit line discharge oscillator further comprises:

a logic unit; and a plurality of bit line discharge units, coupled to the logic unit, wherein the bit line discharge units are serially connected, an input of the first bit line discharge unit is coupled to an output of the logic unit and an output of the final bit line discharge unit is fedback to an input of the logic unit.

11. The circuit of claim 8, wherein the logic unit comprises an XOR gate.

12. The circuit of claim 8, wherein the bit line discharge unit further comprises a memory cell having a word line and a bit line;

a buffer, coupled between the word line and an input of the bit line discharge unit;

an inverter, coupled between the bit line and an output of the bit line discharge unit;

a transistor, coupled between the bit line and the input of the bit line discharge unit, for pre-charging the bit line; and a bit line load, coupled to the bit line.

13. The circuit of claim 12, wherein the memory cell is identical to a memory cell to be simulated.

14. The circuit of claim 13, wherein the memory cells are static random access memory (SRAM) cells.

15. The circuit of claim 8, wherein the operating unit is an adder.

16. A bit line power optimizing method for memory cells, executed by a computing system, the bit line power optimizing method comprising:

obtaining a word line turn-on time corresponding to a worst bit among the memory cells, wherein a minimum offset voltage is satisfied during the word line turn-on time;

obtaining an average offset voltage based on the word line turn-on time, wherein the average offset voltage is a function of the supply voltage;

obtaining a bit line power consumption from the average offset voltage and the supply voltage;

plotting a diagram of the bit line power consumption versus and the supply voltage according to a condition of the manufacturing process;

obtaining a target supply voltage at a reverse point where the bit line power consumption versus is minimum; and outputting the target supply voltage and obtaining an optimized power consumption corresponding to the target supply voltage.

17. The method of claim 16, wherein the average offset voltage is further a function of the supply voltage and a threshold voltage.

18. The method of claim 16, wherein the condition of the manufacturing process comprises a temperature, a threshold voltage or a combination thereof.

19. The method of claim 16, wherein the memory cells are static random access memory (SRAM) cells.

20. The method of claim 16, wherein the SRAM cell is a 6-transistor SRAM.

* * * * *